(12) United States Patent
Ettenberg (10) Patent No.: US 9,935,151 B2
(45) Date of Patent: Apr. 3, 2018

(54) LOW NOISE INGAAS PHOTODIODE ARRAY

(71) Applicant: PRINCETON INFRARED TECHNOLOGIES, INC., Monmouth Junction, NJ (US)

(72) Inventor: Martin H. Ettenberg, Princeton, NJ (US)

(73) Assignee: Princeton Infrared Technologies, Inc., Monmouth Junction, NJ (US)

( * ) Notice: Subject to any disclaimer, the term of this patent is extended or adjusted under 35 U.S.C. 154(b) by 0 days.

(21) Appl. No.: 15/025,072

(22) PCT Filed: Sep. 25, 2014

(86) PCT No.: PCT/US2014/057481
§ 371 (c)(1),
(2) Date: Mar. 25, 2016

(87) PCT Pub. No.: WO2015/048304
PCT Pub. Date: Apr. 2, 2015

(65) Prior Publication Data
US 2016/0218139 A1 Jul. 28, 2016

Related U.S. Application Data

(60) Provisional application No. 61/882,385, filed on Sep. 25, 2013.

(51) Int. Cl.
*H01L 29/80* (2006.01)
*H01L 27/146* (2006.01)
(Continued)

(52) U.S. Cl.
CPC .... *H01L 27/14679* (2013.01); *H01L 27/1461* (2013.01); *H01L 27/1465* (2013.01);
(Continued)

(58) Field of Classification Search
CPC ..... H01L 27/146; H01L 29/66; H01L 29/808; H01L 31/0304; H01L 31/105;
(Continued)

(56) References Cited

U.S. PATENT DOCUMENTS 4,904,608 A 2/1990 Gentner et al.
4,990,990 A 2/1991 Albrecht et al.
(Continued)

FOREIGN PATENT DOCUMENTS

EP 216572 A2 4/1987
WO 2013007753 A1 1/2013

OTHER PUBLICATIONS

European Search Report for EP14849578.1 dated Mar. 3, 2017.
(Continued)

*Primary Examiner* — Charles Garber
*Assistant Examiner* — Abdulfattah Mustapha
(74) *Attorney, Agent, or Firm* — Fox Rothschild LLP (57) ABSTRACT

A photodiode pixel structure for imaging short wave infrared (SWIR) and visible light built in a planar structure and may be used for one dimensional and two dimensional photodiode arrays. The photodiode arrays may be hybridized to a read out integrated circuit (ROIC), for example, a silicon complementary metal-oxide-semiconductor (CMOS) circuit. The photodiode in each pixel is buried under the surface and does not directly contact the ROIC amplification circuit. Charge is transferred form the detector using a junction field effect transistor (JFET) in each pixel. Disconnecting the photodiode from the ROIC amplification circuit enables low dark current as well as double correlated sampling in the pixel.

6 Claims, 12 Drawing Sheets

(51) Int. Cl.
*H01L 29/66* (2006.01)
*H01L 29/808* (2006.01)
*H01L 31/0304* (2006.01)
*H01L 31/105* (2006.01)
*H01L 31/18* (2006.01)

(52) U.S. Cl.
CPC .. *H01L 27/14609* (2013.01); *H01L 27/14652* (2013.01); *H01L 27/14694* (2013.01); *H01L 29/66901* (2013.01); *H01L 29/808* (2013.01); *H01L 31/03046* (2013.01); *H01L 31/105* (2013.01); *H01L 31/1844* (2013.01)

(58) Field of Classification Search
CPC ............... H01L 31/18; H01L 27/14609; H01L 31/03046; H01L 29/66901; H01L 27/1461; H01L 27/14679; H01L 31/1844; H01L 27/1465; H01L 27/14652; H01L 27/1469
See application file for complete search history.

(56) References Cited

U.S. PATENT DOCUMENTS

| | | | |
|---|---|---|---|
| 5,023,686 A | 6/1991 | Helmut et al. | |
| 5,242,839 A | 9/1993 | Oh et al. | |
| 5,386,128 A | 1/1995 | Fossum et al. | |
| 5,387,796 A | 2/1995 | Joshi et al. | |
| 6,005,266 A * | 12/1999 | Forrest | H01L 27/14649 257/256 |
| 6,573,581 B1 * | 6/2003 | Sugg | H01L 31/03042 257/451 |
| 7,115,910 B2 | 10/2006 | Dutta | |
| 7,598,582 B2 | 10/2009 | Boisvert et al. | |
| 7,759,698 B2 | 7/2010 | Ogura | |
| 7,759,703 B2 | 7/2010 | Nam et al. | |
| 7,855,400 B2 | 12/2010 | Nakaji et al. | |
| 8,022,449 B2 | 9/2011 | Nagai | |
| 8,039,882 B2 | 10/2011 | Mouli | |
| 8,174,118 B2 | 5/2012 | Nagai et al. | |
| 8,274,127 B2 | 9/2012 | Nagai et al. | |
| 8,354,324 B2 | 1/2013 | Yao | |
| 8,399,820 B2 | 3/2013 | Trezza et al. | |
| 8,399,909 B2 | 3/2013 | Bui et al. | |
| 2004/0000681 A1 * | 1/2004 | Shinohara | H01L 27/14609 257/290 |
| 2008/0111152 A1 | 5/2008 | Scott et al. | |
| 2009/0189234 A1 | 7/2009 | Mabuchi | |
| 2009/0295960 A1 | 12/2009 | Inada et al. | |
| 2010/0301441 A1 | 12/2010 | Pan et al. | |
| 2011/0147707 A1 | 6/2011 | Inada et al. | |
| 2013/0001731 A1 | 1/2013 | Forrest et al. | |

OTHER PUBLICATIONS

International Search Report for PCT/US2014/057481 dated Mar. 31, 2015.

Kim et al., "Readout Characterisitcs of integrated Monolithic InGaAs Sensor Array," (1997) Abstract pp. 1-10.

Kim et al., "Two-dimensional Active Pixel InGaAs Focal Plane Arrays," (2001) Abstract pp. 1-7.

Kim et al., "Characteristics of Monolithically Integrated InGaAs Active Pixel Imager Array," (1999); Abstract pp. 1-9.

Wang et al., "High-Speed InGaAs P—I—N Photodetector With Planar Buried Heterostructure," IEEE Transactions on Eletron Devices (Jun. 2009); 56(6):1347-135.

* cited by examiner

| Layer | Label |
|---|---|
| $InAs_yP_{1-y}$ n-- | 58 |
| $InAs_yP_{1-y}$ p++ | 57 |
| $InAs_yP_{1-y}$ n-- | 56 |
| $In_xGa_{1-x}As$ i | 55 |
| $InAs_yP_{1-y}$ n-- | 54 |
| $InAs_yP_{1-y}$ n-- | 53 |
| $InAs_yP_{1-y}$ n-- | 52 |
| InP n-- | 1 |
| InP substrate | 13 |

FIG. 4B

| Layer | Label |
|---|---|
| InP n-- | 5 |
| InP p++ | 4 |
| InP n-- | 3 |
| $In_{0.53}Ga_{0.47}As$ i | 2 |
| InP n-- | 1 |
| InP substrate | 13 |

LOW NOISE INGAAS PHOTODIODE ARRAY

CROSS REFERENCE TO RELATED APPLICATIONS

The present application is a U.S. National Stage application of International Application No. PCT/US2014/057481, filed Sep. 25, 2014, which application claims the benefit of U.S. Provisional Application Ser. No. 61/882,385, filed on Sep. 25, 2013, the contents of each are hereby incorporated by reference in their entirety.

FIELD OF THE DISCLOSURE

This invention relates a device that allows for detection of visible and short wave infrared light with $In_xGa_{1-x}As$ detector arrays.

BACKGROUND OF THE INVENTION

Photodetector arrays made from indium gallium arsenide (InGaAs) alloys have been used in many applications, i.e. telecommunications, spectroscopy or imaging to name a few for over 25 years. Depending on the composition of the $In_xGa_{1-x}As$ alloy the detectors can detect light from 500 nm to 2700 nm. The most common composition is $In_{0.53}Ga_{0.47}As$, which is lattice matched to InP enabling detection from 0.5 um to 1.7 um. These can be manufactured into detector arrays (either one dimensional (1-D) or two dimensional (2-D)), which are then attached to a read out integrated circuit (ROIC) to form a focal plane array. The ROIC converts the charge collected over time to a voltage through amplification. It enables one to measure the amount of light that strikes each pixel in the detector in a given amount of time.

Typically, InGaAs arrays are planar structures with p-i-n (positive-intrinsic-negative) or p-n (positive-negative) photodetector arrays that are monolithic in nature. The detector array has a high bandgap semiconductor (e.g., InP, $InAs_yP_{1-y}$, $In_xAl_{1-x}As_yP_{1-y}$, etc.) above the $In_xGa_{1-x}As$ to minimize dark current and surface recombination from electron hole pairs that form in the detector material. The pixel is formed by diffusing or implanting a p-type dopant like Zn, C, or Be into the structure at certain specific points down to the $In_xGa_{1-x}As$ layer to make the pixel which is a p-i-n or the p-n detector as opposed to doping the entire layer and etching away material to form a mesa structure. An ohmic contact or near ohmic contact is made on top of the diffused area to allow the pixel to be biased and connected to a circuit to remove the charge collected (both dark charge as well as charge from photons that are converted to electron hole pairs). A second contact is made (cathode contact) elsewhere to the n-side material or the substrate, typically InP or $InAs_yP_{1-y}$, to allow the circuit to be completed.

Many conventional techniques have been developed to improve the dark current or the speed of these planar devices. For example, U.S. Pat. No. 6,573,581 describes intentionally doping the intrinsic region of a p-i-n photodiode to reduce the dark current in planar structures. U.S. Pat. No. 4,682,196 describes a structure for making high speed, low dark current devices. Known conventional techniques all require that the photodiode is directly connected to the amplification circuit. U.S. Pat. No. 4,904,608 and/or U.S. Pat. No. 5,242,839 describe lowering the dark current of mesa detector devices. However, mesa devices are isolated from one another physically. In a mesa device the physical isolation prevents cross talk between pixels and causes a loss in some signal and leads to overall higher dark current because the surfaces are not passivated.

U.S. Pat. No. 4,656,494 or U.S. Pat. No. 8,039,882 describes avalanche photodiodes, which have a buried detector layer. The avalanche photodiode attempts to place gain in the detector material to allow for amplification of the signal. The avalanched photodiode, for example, is buried to allow for multiplication of the charge to occur or for a guard ring to be created. The guard ring is to prevent the gain from spreading beyond the avalanche photodiode.

Photodiodes with field effect transistors (FETs) are also known in the art. For example, in U.S. Pat. No. 5,023,686, describes two separate devices developed in one growth that are physically separated by a trench and a non-conductive layer of material. The FET is electrically connected to photodiode through metals and the FET acts as an amplifier. A p-region is buried to further isolate and optimize the FET. U.S. Pat. No. 4,990,990 describes a photodiode with a FET and a waveguide and the FET controls the waveguide which is a different application from creating a low noise imaging application. U.S. Pat. No. 6,005,266 has InGaAs photodiodes integrated with JFETs but these JFETs are for allowing a detector to be turned on or off to determine if it is detecting light. It is for creating a monolithic integrated detector and multiplexer. This does not lower the dark current of the detectors and avoids the need for a ROIC or silicon multiplexer. U.S. Pat. No. 5,386,128 further describes a CCD and an InGaAs photodiode integrated into a single imaging device. The described device moves charge from the photodiode to the integrated amplification circuit. This device specifically requires the photodiode to be directly connected to the amplification circuit and does not use a buried photodiode to reduce the dark current.

In U.S. Pat. No. 5,689,122, a heterojunction bipolar transistor (HBT) is combined with a photodetector on the same substrate to allow for ease of integration. However, the HBT is separated from the photodiode by a trench and they are connected by metal lines or wires. This is not an integrated monolithic device. Pinned photodiodes are conventionally used in most modern Silicon complementary metal-oxide-semiconductor (CMOS) imagers. For example, U.S. Pat. No. 6,297,070 discloses a low noise silicon photodiode that also allows charge transfer similar to a CCD in CMOS devices, thus enabling correlated double sampling in the pixel to lower noise.

SUMMARY OF THE INVENTION

An array of photodiodes using InGaAs detectors for detecting visible and shortwave infrared light (e.g., wavelength range 0.5 to 2.7 µm) and has a buried p-n or p-i-n junction photodiode to reduce the dark current is disclosed. These detector arrays are hybridized to a Read Out Integrated Circuit (ROIC) or a multiplexer, which is an array of read out circuits that have amplification circuits and the ability to store charge from each detector in the detector array. The combination of detector, amplification and charge storage forms a pixel, and the combined unit of ROIC and detector array is called a focal plane array. In this design the photodiode is not directly connected to the ROIC amplification circuit typically manufactured in a complementary metal-oxide-semiconductor (CMOS) process. To allow the charge to be removed from the photodiode to the ROIC a junction field effect Transistor (JFET) is also integrated in every detector pixel. The drain of the JFET is connected to the ROIC while the source is the buried photodiode. Separating the photodiode from the amplification circuit minimizes read noise from the ROIC as well as dark current on the photodiode. The photodiode is truly at zero bias thus minimizing dark current. In addition burying the photodiode minimizes surface defects as well as defects caused by forming a contact to the diode.

A photodiode array comprised of the above structure can be manufactured in a single epitaxy growth run or through a regrowth process. If the structure is grown in one step then the layers and the diffused or implanted regions are made in order. If a regrowth process is utilized, then some layers can be grown initially if they are lattice matched or additional buffer layers may be used if non-lattice matched InGaAs is used. The diffusion or ion implantation of p-dopants to form the buried photodiode can then occur followed by a regrowth of cap layers.

BRIEF DESCRIPTION OF THE DRAWINGS

Embodiments will be described with reference to the following drawing figures, in which like numerals represent like items throughout the figures, and in which:

FIG. 10 is a diagram showing the deposition of the p-contacts (14, 15) to the drains (9,10) in a lattice matched photodiode; and.

DETAILED DESCRIPTION

The present disclosure describes planar devices, which allow a complete interconnected array of pixels with no loss of material between pixels thus no loss in signal. In various implementations, an InGaAs detector array that has a buried photodiode (either p-n or p-i-n) and a junction field effect transistor (JFET) or multiple JFETs in each pixel to allow the movement of charge from the buried photodiode to a read out integrated circuit (ROIC) without the ROIC being directly connected to the photodiode. In some scenarios, the JFETs may be integrated to the photodetector in each pixel to allow movement of charge to the ROIC. A second JFET may be used to remove charge from the first JFET. This second JFET may be in each individual pixel or it may be a larger device that works an entire column or row simultaneously or 2 rows or 2 columns simultaneously. The multiple JFETs combined with the buried photodiode enables double correlated sampling in the pixel as well as lower capacitance in the connection to the ROIC, thereby enabling low read noise readouts. This scheme enables us to move charge noiselessly from the photodiode to the ROIC similar to a Charge Coupled Device (CCD). In addition it lowers the dark current of the photodiode because there is no bias applied to the photodiode from the ROIC and the photodiode does not contact the surface limiting the number of defects. Some embodiments may be entirely monolithic and may be used for multiple alloys of $In_xGa_{1-x}As$ (e.g., $In_{0.53}Ga_{0.47}As$, also known as InGaAs) detector arrays from, for example, $In_{0.50}Ga_{0.50}As$ to $In_{0.95}Ga_{0.05}As$. The JFET may be formed in the $InAs_yP_{1-y}$ cap layers, enabling the charge to be moved from the buried photodiode.

In Si CMOS imagers, for example, buried photodiodes may be built with transfer gates to move the charge from the buried photodiode. Buried photodiodes have not been developed in infrared imagers because these are traditionally hybrid devices. A hybrid device or focal plane array is a device where the infrared imager is a detector material(s) (InGaAs, InSb, HgCdTe, Ge, etc.) and it is attached to Read Out Integrated Circuit (ROIC) with electronic circuitry this is a second material, typically Si CMOS. The attachment between the detector and ROIC uses indium bump or another hybridization technology, for example, each pixel or picture element is the connection from the detector to the ROIC. It is difficult to hybridize two materials, such as InGaAs and Si CMOS ROIC, especially on a device with small pitch, spacing between pixels. Each pixel may require a separate contact to the ROIC. Buried photodiode technology requires multiple contacts for a single pixel to integrate the switching circuits to move the charge from the buried photodiode adding additional complication to the hybridization. In addition to the hybridization issues, it is necessary to build a circuit beyond a photodiode in every pixel, which significantly adds difficulty, complexity, and cost to the process. The inventive photodiode arrays described herein overcome these and other deficiencies in the field of infrared photodiode arrays.

Figure 1A:
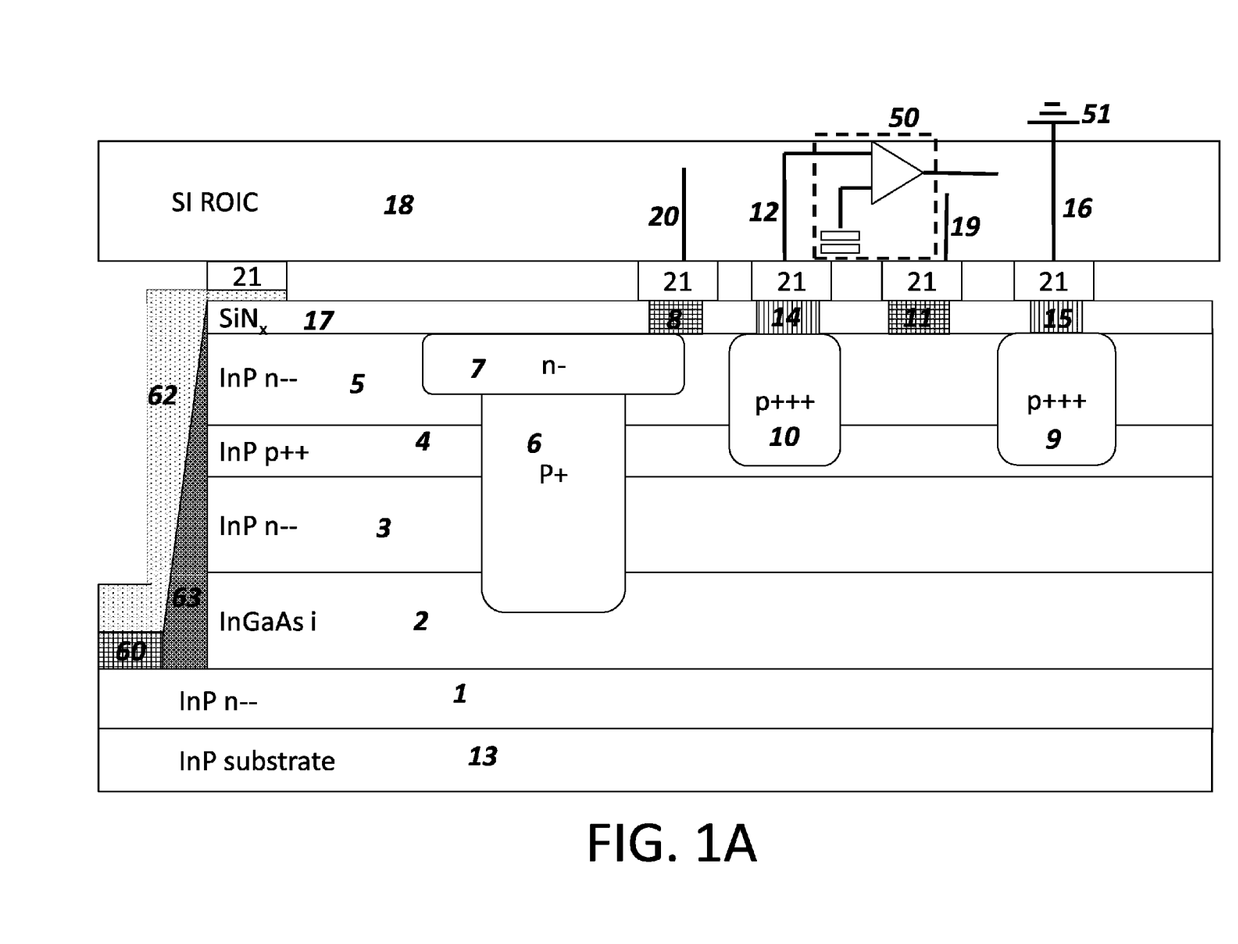
FIG. 1A is a cross section diagram of an example buried photodiode structure suitable for $In_xGa_{1-x}As$ material lattice matched to InP for visible and SWIR light detection.

Referring now to FIG. 1A, a first embodiment of a photodiode is shown. In the first embodiment, the detector structure may be grown epitaxialy on InP substrates 13 or other substrates like InAs or GaAs which may be n-type or semi-insulating. The detector structure is developed by placing an InP n-type layer 1 followed by an $In_xGa_{1-x}As$ layer, for example an $In_{0.53}Ga_{0.47}As$ alloy (which is lattice matched to the InP substrate, it is abbreviated as InGaAs in drawing), which is used as the detector layer 2. The $In_xGa_{1-x}As$ layer may be undoped or intrinsic. The $In_xGa_{1-x}As$ layers may be doped n type but it is not required. The thickness of the $In_xGa_{1-x}As$ may be from 0.5 µm to 6 µm thick. On top of the $In_{0.53}Ga_{0.47}As$ 2 an InP cap (3, 4, 5) layer may be grown. The cap is composed of three InP layers each doped differently. The layer 3 is n type semiconductor having a carrier concentration in the range of about $1\times10^{15}$ to $3\times10^{19}$ per $cm^3$ and a thickness ranging from about 0.05 μm to 2 μm. The layer 4 may be about 0.05 μm to 2 μm thick of p-type material with a doping of $1\times10^{15}$ to $3\times10^{19}$ per $cm^3$. The layers 4, 5 may be grown in the same growth run as layers 1 and/or 2, 3 or it may be grown afterward in a regrowth following diffusion of the dopants to form the buried photodiode 6. The fifth layer 5 may be 0.1 μm to 2 μm thick and may be composed of n-type InP with an n-type doping of $1\times10^{15}$ to $3\times10^{19}$ per $cm^3$. A silicon-nitride $SiN_x$ or other passivation layer (17) may also be applied after the growth is completed to passivate the surface. Holes are opened in the passivation to diffuse or ion-implant the various dopant constituents (6, 7,9, 10) as well as the n-contact for gates (8, 11, 26, 32) and cathode contacts (60) and p-contacts for drains of the JFET (14, 15, 27, 34) to the JFET gates and drains. Sidewall passivation (63) may be needed to protect the structure near the edge of the array and a metal path (62) to bring the cathode contact (60) to the array surface for hybridization (21).

To form the buried photodiode 6 a p-type dopant, e.g., Zn, will be diffused into or ion implanted through the InP cap layers 3, 4, 5 to the InGaAs layer 2. This is done by opening a hole in layer 17 to allow the p-type dopant to be diffused or ion-implanted. The dopant may be deposited from 0.01 μm to 4 μm deep in the InGaAs layer 2 through layers 3, 4, and 5. Alternatively the p-type dopant may be diffused or ion implanted before layer 4, and/or 5 are grown. The depth of the dopant should be the same, 0.01 μm to 4 μm deep in the InGaAs, then layer 4, and 5 of the InP may be grown in, a regrowth process as described above. Alternatively if InP layer 5 already exists from the initial growth the p-type dopant is added to form 6 then an n-type dopant 7 may be placed in layer 5 above the buried photodiode 6. The n-type dopant 7 should be ion implanted or diffused into the surface above the photodiode to achieve a similar or greater n-type doping profile to the rest of the cap layer 5. The area of region 7 needs to be wider then region 6 so the p-type volume 6 is completely covered, no p-type material may contact the surface. To create a wider area of coverage a wider hole would be opened in layer 17 to enable the ion-implant or diffusion of n-type dopant. The depth of the ion implant may be from the surface to 0.05 μm to 1 μm deep depending on the layer thickness of the InP layer 5. A new passivation layer is applied to cover 7. Holes are open in the passivation layer 17 to allow a p-type dopant to be diffused or ion-implanted into the material through the n-type layer 5 to the InP p-type second layer 4 to form JFETs drains 9, 10. The p-type dopant must enter the p-type layer 4 but may not diffuse beyond the p-type layer to the n-type layer 3 below it. Following the addition of the p-type and n-type dopants 6, 7 the holes in the passivation 17 for the p-type diffusion or ion-implantation and n-type diffusion or ion-implantation is closed.

Following the manufacture of the buried photodiode the JFET drains 9, 10 are formed. Transfer JFET drain (JFET-T) 10 may allow charge to be removed from the photodiode while refresh JFET drain (JFET-D) 9 may enable charge to be cleared from JFET-T 10. Once the diffusions are complete ohmic contacts 14, 15 may be made to both JFETs drains. After the p-contacts are formed the n-contacts for the gates for the JFETs 8 and 11 and the cathode contact 60 may be established. The n-contact to establish the gate 8 controlling the flow of charge between the ROIC circuit 50 and the buried photodiode 6. The n-contact 11 establishes the gate controlling the flow of charge between 10 and 9. Applying or removing applied voltages to these gates 8 and 11 allow the ROIC to control the flow of charge between the photodiode and the various JFET drains. Before the n-contacts are formed by making holes in the passivation layer 17, a hole is formed in the passivation layer at the end of the array and material is removed from the surface layer 5 down to the substrate 13 or the first InP epitaxial layer 1. Passivation is applied to cover the sidewalls 63. N-contacts are then formed at 60, 8 and 11 simultaneously. The n-contact 60 on the initial InP n-type layer 1 or on the substrate 13 is the cathode connection allows the completion of the circuit for attachment to the ROIC 35 (shown in FIG. 2). Metal 62 is generally applied to allow a connection between the cathode 60 and the top surface of the photodetector array to make hybridization of the ROIC 18 to the photodetector array simpler by placing all of the connection points (21) on a single planar surface.

The photodiode array may be attached to the ROIC 18 through various techniques available for hybridization, i.e. Indium bumps 21. The ROIC 18 will control the gate voltages to 8 and 11 allowing charge to be moved from the photodiode to 10 and then 50 or 9 and thus 51. The ROIC 18 can then either store the charge collected from the charge removed at 12 in the amplification and storage circuit 50 or move charge from 10 to 9 and discard it to ground 51 depending on the operation. This setup allows for zero bias on the photodiode and minimizes dark current from surface defects in the photodiode. Charge may be moved from the photodiode 6 similar to a CCD thus allowing for correlated double sampling in the pixel and other techniques to reduce the noise i.e. kTC noise in the ROIC 18 at the circuit 50 and at the same time minimize dark charge from the photodetector 6.

Figure 1B:
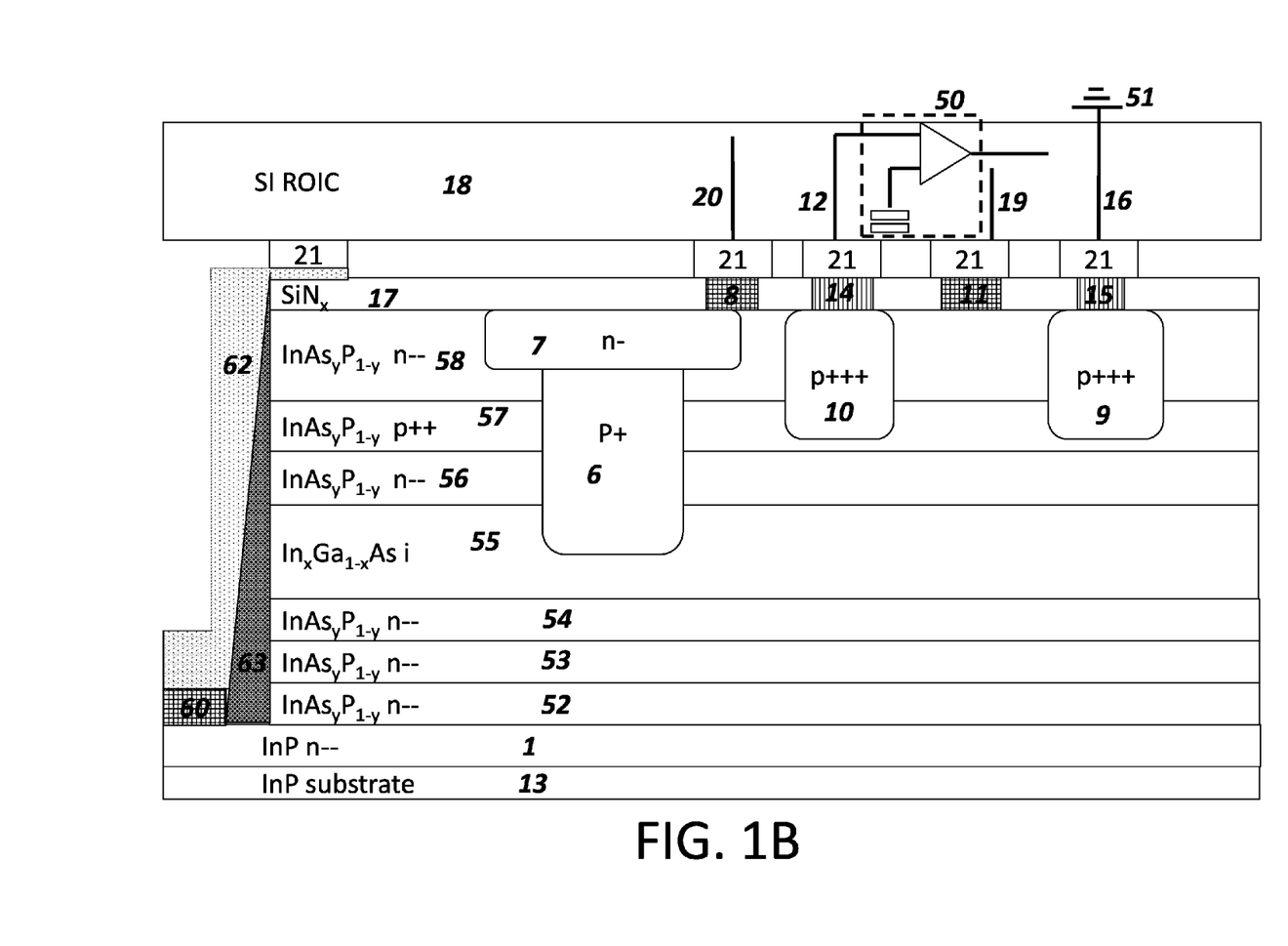
FIG. 1B is a cross section diagram of an example structure of $In_xGa_{1-x}As$ photodiode structure for visible and extended SWIR wavelength non-lattice matched to InP.

Referring now to FIG. 1B, the second embodiment of a photodiode is shown with non-lattice matched $In_xGa_{1-x}As$. In the second embodiment, the detector structure is also grown epitaxialy on InP substrates 13 or other substrates like InAs or GaAs which may be n-type or semi-insulating. The detector structure is developed by placing an InP n-type layer 1 followed by any/multiple $InAs_yP_{1-y}$ (e.g., 52, 53, 54) that are needed to grade the material to modify its lattice constant to enable a lattice match to the $In_xGa_{1-x}As$ alloy used as the detector layer 55. The $In_xGa_{1-x}As$ layer 55 may be undoped or intrinsic. The $In_xGa_{1-x}As$ layers can be doped n type but it is not required. The thickness of the $In_xGa_{1-x}As$ may be from 0.5 μm to 6 μm thick. On top of the $In_xGa_{1-x}As$ 55 an $InAs_yP_{1-y}$ cap 56, 57, 58 layer may be grown that has the same lattice constant as the $In_xGa_{1-x}As$ 55. The cap is composed of three $InAs_yP_{1-y}$ layers each doped differently and with different thicknesses. The layer 56 is n type semiconductor having a carrier concentration between $1\times10^{15}$ to $3\times10^{19}$ per $cm^3$ and may range from 0.05 μm to 2 μm thick. The layer 57 may be 0.05 μm to 2 μm thick of p-type material with a doping of $1\times10^{15}$ to $3\times10^{19}$ per $cm^3$. The layers 57 and 58 may be grown in the same growth run as layers 1 and/or 52, and 56 or it may be grown afterward in a regrowth following diffusion of the dopants to form the buried photodiode 6. The top cap layer 58 may be 0.1 μm to 2 μm thick and may be composed of n-type $InAs_yP_{1-y}$ with an n-type doping of $1\times10^{15}$ to $3\times10^{19}$ per $cm^3$. A $SiN_x$ or other passivation layer (17) may also be applied after the growth is completed to passivate the surface. Holes are opened in the passivation to diffuse or ion-implant the various dopant constituents (6,7,9,10) as well as the n-contact for gates (8,11,26,32) and substrate connection 60, and p-contacts for drains of the JFETs (14,15,27,34). Similarly to FIG. 1A passivation of the side walls is conducted 63 and metal is applied 62 to bring the substrate contact 60 to the surface for hybridization 21.

This detector structure as described above is attached to a ROIC. The buried photodiode will require this device to operate differently then a standard InGaAs focal plane array. Typically the photodiode is directly attached to the ROIC. The photodiode is also typically put in reverse bias or near reverse bias. Light is shined on the detector array and if energy of that photon is high enough it will allow the creation of an electron-hole pair. This electron-hole pair is in addition to dark current or electron-hole pairs which naturally form in the pixel as long as one is above absolute zero in temperature. The charge created by the photon or by dark current is then trapped in the field created by the reverse bias at the p-i-n or p-n junction and the charge is then moved to the ROIC. The ROIC has an amplification circuit, which then converts the charge to a voltage and allows one to measure the amount of charge created by photons and dark current in a given amount of time. The photodiode is connected to the ROIC circuit and charge created by any mechanism is moved directly to the ROIC circuit. With this new detector structure the detector is not directly connected to the ROIC amplification circuit. A "switch" is placed in the detector material to control the charge flow from the photodiode to the ROIC 18 which has an amplification/storage circuit 50 at each pixel or set of pixels. The charge movement is now controlled by the ROIC 18 through the JFETs. The switch is a JFET (8, 10, 14) in this case. The photodiode formed by the p-i-n junction at 6, 2, and 1 still collects dark charge as well as charge created from photons landing in the photodiode array. The charge is stored in the p-i-n or p-n junction. After a specific amount of time, i.e the integration time or a part of the integration time if one is trying to achieve a greater dynamic range, the charge will need to be moved from the buried photodiode to the drain of the JFET-T (10). To move the charge the gate of JFET-T 8 must be opened (no voltage applied to the gate of JFET-T (8)). To prevent the flow of charge from the photodiode to the drain of JFET-T (10,12) a voltage is applied to the gate (8), this closes the switch. The voltage is applied to 8 during the integration time to build charge on the photodiode (6). When the switch 8 is closed one can also measure the charge on the drain of JFET-T at 10. This allows double correlated sampling and enables the reduction of read noise in the circuit by measuring the kTC noise before and after the charge from the photodiode is moved. To ensure all of the charge is removed from the drain of JFET-T 10 a second JFET, JFET-D (9, 11, 15) is used. When JFET-T has its gate closed 8 between the photodiode 6 and its' drain (10) JFET-D could have its gate open 11. This allows charge to move from JFET-T to JFET-D. When JFET-T is open and is accepting charge from the photodiode or when JFET-T drain 10 is being sampled by the circuit 50 to measure the amount of charge captured JFET-D's gate (11) has a voltage applied to close its switch so the charge does not move to JFET-D drain 9. When charge is being moved from the photodiode to JFET-T drain (10) it is desired that no charge is lost to the JFET-D drain (9) or ground 51. The gate on JFET-D (11) only has its voltage turned off when charge is looking to be removed from JFET-T drain (10).

Figure 2:
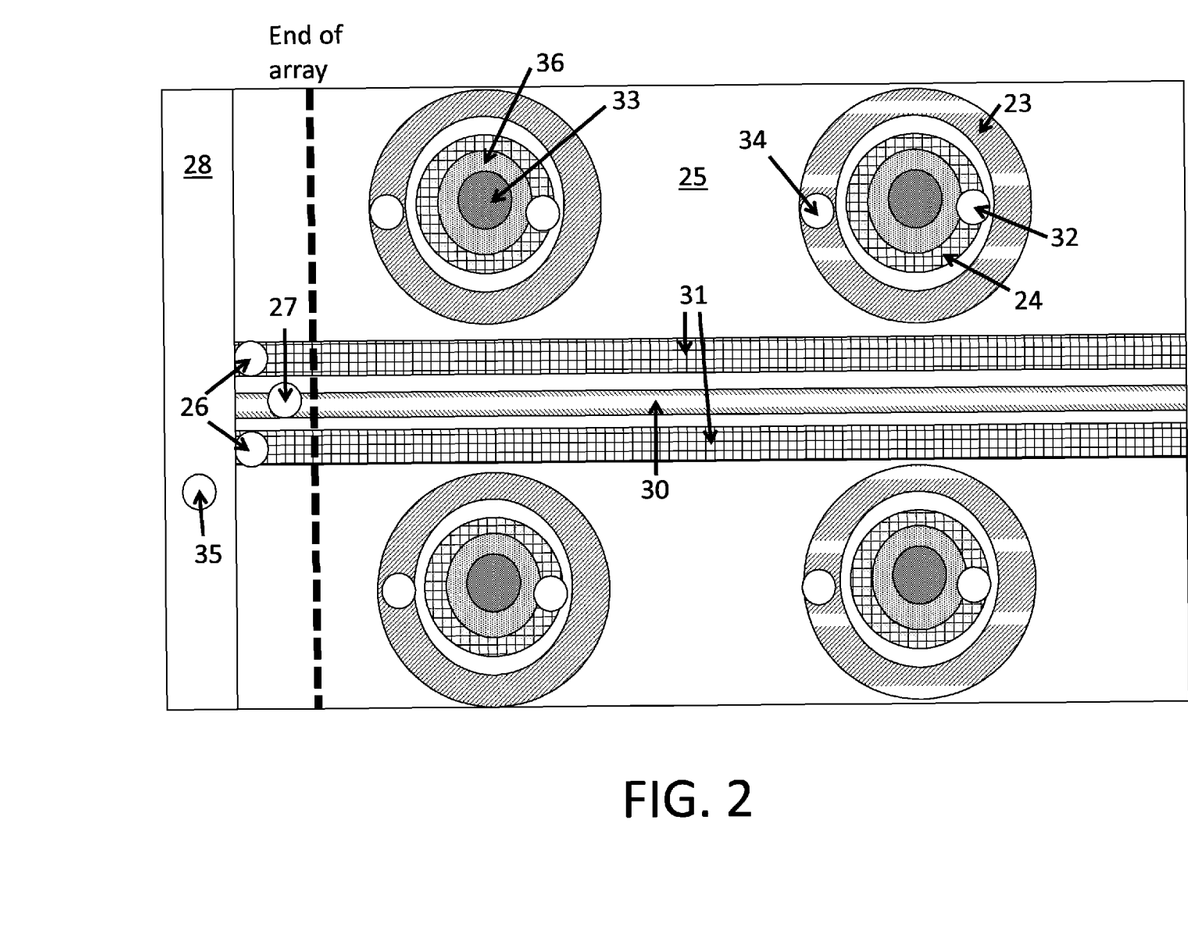
FIG. 2 is a diagram of an example a two dimensional photodiode array as viewed from the top.

Referring to FIG. 2, it is a top view of a photodiode array (one-dimensional or two-dimensional with 2-dimensional shown in FIG. 2 in InGaAs detector alloys with a buried photodiode (33) and a Junction Field Effect Transistor(s) in each pixel to allow for movement of charge to a Read Out Integrated Circuit. It is comprised of a plurality of photodiodes as described above in relation to FIG. 1. The following layers are included: a substrate (layer 13 of FIG. 1) of InP that is either n-type or semi-insulating; first layer (layer 1) of InP buffer layer of n-type material; a second layer (layer 2 of FIG. 1) of $In_{0.53}Ga_{0.47}As$ layer of intrinsic or undoped material that is 1 μm to 6 μm thick; a third layer (layer 3 FIG. 1) of InP layer of n-type material ($1\times10^{14}$ to $5\times10^{19}/cm^3$) that is 0.5 μm to 2 μm thick; a fourth (layer 4 of FIG. 1) of InP layer of p-type material ($1\times10^{14}$ to $5\times10^{19}$ per $cm^3$) that is 0.05 to 1 μm thick; a fifth layer (layer 5 of FIG. 1) of InP layer of n-type material ($1\times10^{14}$ to $5\times10^{19}$ per $cm^3$) that is 0.1 μm to 2 μm thick.

A photodiode array comprised of the above structure can be manufactured in a single epitaxy growth run or through a regrowth process. Either after the deposition of the fourth layer or the fifth layer, holes are opened in the passivation layer 17, a diffused or ion-implanted p-junction (buried photodiode 6 of FIG. 1) through the third, fourth, and fifth layers and into the second layer (layer 2 of FIG. 1) to form a p-i-n or p-n photodetector. The p-type dopant (buried photodiode 6 of FIG. 1) may be diffused from 0.1 μm to 5.5 μm in depth of the second layer. The position of buried photodiode 33 is shown but would not be directly viewable since it is buried under n-type region 36, which is wider in area and is touching the surface. If the p-type region is implanted or diffused after the fifth layer is deposited, a diffused or ion-implanted n-type region (region 7 of FIG. 1) is deposited above the diffused p-type region that buries the junction below the surface of the fifth layer. The depth of the n-type implant is 0.1 μm to 2 μm into the fifth layer. It should not enter the p-type layer of InP (layer 4 of FIG. 1). If the p-type region is implanted after the fourth layer, the above n-type implant is not required since the regrowth of the fifth layer accomplishes a similar structure. The holes in the passivation layer 17 for the p-type diffusion or ion-implantation and n-type diffusion or ion-implantation are closed.

After the deposition of the fifth layer (or of the n-type implant) a new set of holes are opened in the passivation layer 17 to form the JFETs by diffusing or ion implanting a p-type region for JFET drains 23 and 30 (p-type implant 10 of FIG. 1) and (p-type implant 9 of FIG. 1). The diffused p-type region should be deep enough so it reaches the InP p-type region of the fourth layer (layer 4 of FIG. 1) but not be so deep that it enters the n-type InP zone of the third layer (layer 3 of FIG. 1).

Referring again to FIG. 2, a 2-D photodiode array is shown. Photodiode arrays such as those described above need not have two JFETs in every pixel. A single JFET drain 23 and gate 24 may be included with each buried photodiode (JFET-T) and the second JEFT for clearing charge (JFET-D) from the first JFET can be a row or column based JFET with the gate control 31 running the length of the row or column and the JFET-D drain 30 running the length of the row or column. The connection to the gate 26 and drain 27 of the row or column JFET can be made on the end of the array by the substrate connection 35 (60 in FIG. 1A) of the array allowing the circuit to be completed by attaching to the ROIC 18. This simplifies the hybridization of the photodiode array to the ROIC by having only two connections at each pixel versus four. Less is needed in each individual pixel, this allows for a smaller pitch device since fewer connections at each pixel.

Figure 3A:
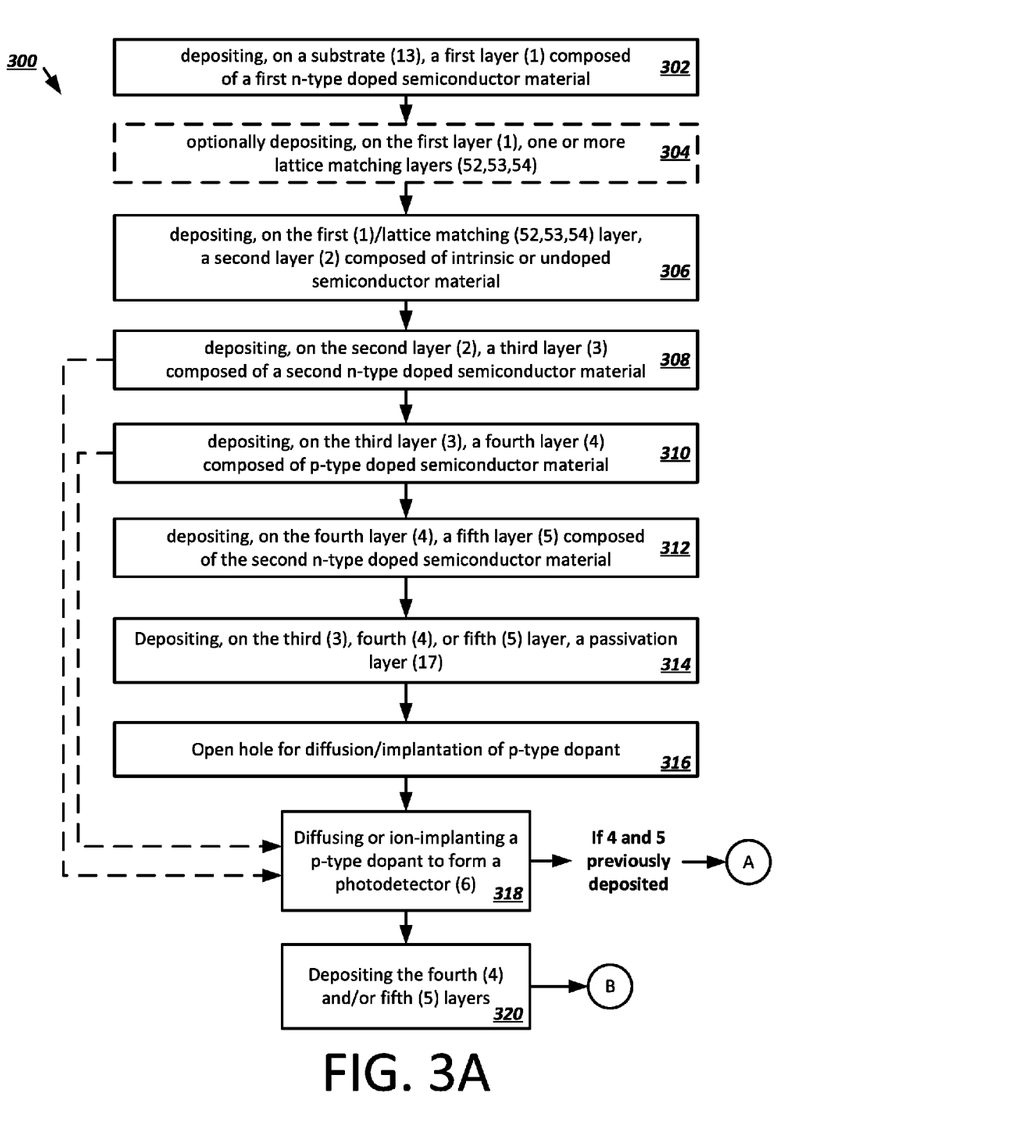
FIGS. 3A-B is a flowchart showing a method of manufacture for a buried photodiode.
Figure 3B:
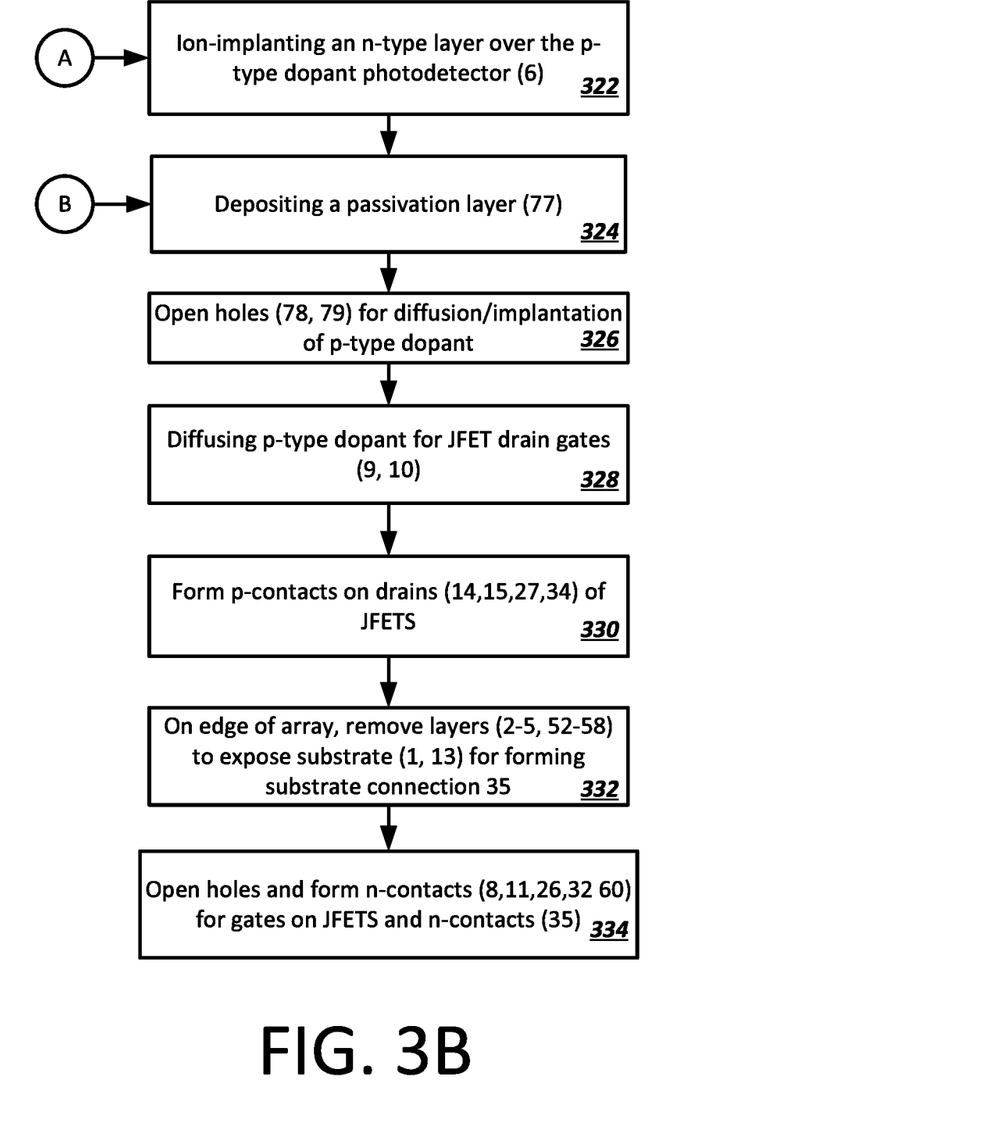

Referring to FIG. 3, a method 300 is described to form an array of photodiodes in InGaAs detectors for detecting visible and shortwave infrared light that has a buried photodiode to reduce the dark current that is not directly connected to the ROIC. A JFET may also be integrated in every pixel to allow the charge to be removed from the photodiode to a ROIC. The JFET may be connected to the ROIC.

Figure 4A:
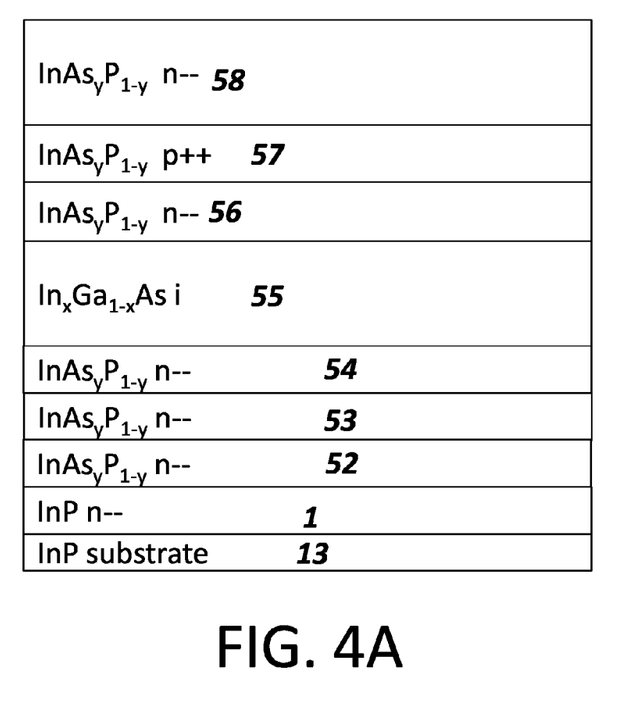
FIG. 4 is diagram showing the deposition of the semiconductor layers of (A) an extended wavelength photodiode and (B) a lattice matched photodiode.
Figure 4B:
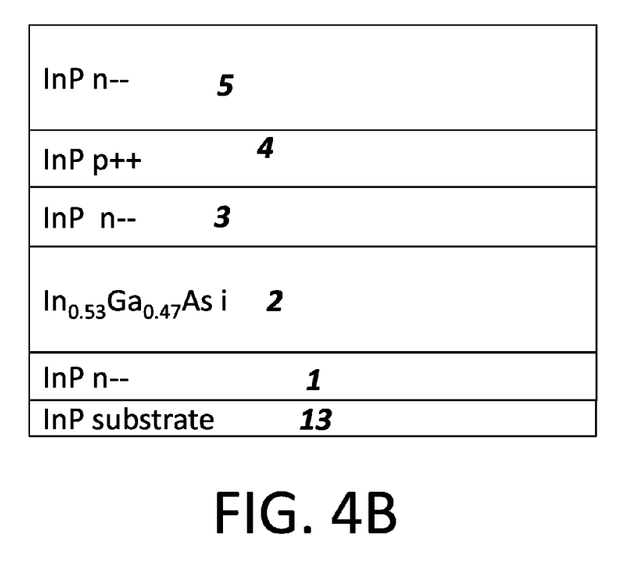

The method includes depositing, on a substrate, a first n-type doped semiconductor layer 302. The first n-type doped semiconductor layer may be, for example, InP. Optionally, one or more additional layers may be deposited on the semiconductor layer 304. The additional layers may be composed of $InAs_yP_{1-y}$ and deposited to transition from the lattice constant of the first n-type doped semiconductor layer to that of an $In_xGa_{1-x}As$ alloy deposited as a higher layer, as shown in FIG. 4A. An undoped or intrinsic semiconductor layer is deposited on the first n-type doped semiconductor layer 306 (or the top additional layer). The undoped or intrinsic semiconductor layer may be, for example, an $In_xGa_{1-x}As$ alloy. As described above, the one or more additional layers can be deposited to transition from the first n-type doped semiconductor layer to the $In_xGa_{1-x}As$. When $In_{0.53}Ga_{0.47}As$ is used, no additional layers are required to provide lattice matching, as shown in FIG. 4B. Dopants for p-type may include Zn, Be, and/or C for example. Dopants for the n-type may include S, Si, Ge, Se, and/or Sn for example.

A cap comprised of alternating n-type and p-type doped semiconductor layers is deposited on top of the undoped or intrinsic semiconductor layer, as shown in both FIGS. 4A (in extended wavelength cases where additional layers are required to match lattice constants) and 4B (in cases where $In_{0.53}Ga_{0.47}As$ is used). A first cap layer comprising second n-type doped semiconductor layer is deposited on the undoped or intrinsic semiconductor layer 308. The first cap layer may be, for example, comprised of $InAs_yP_{1-y}$, doped n-type to a carrier concentration from about $1 \times 10^{15}$ to $3 \times 10^{19}$ per cm$^3$ and may have a thickness of 0.25 μm to 2 μm. In cases where $In_{0.53}Ga_{0.47}As$ is used, the cap layers are composed of InP, i.e. $InAs_yP_{1-y}$ where y=0. A second cap layer is deposited over the first cap layer and comprises a p-type doped semiconductor layer 310. The second cap layer may be, for example comprised of InP, doped to a carrier concentration from about $1 \times 10^{15}$ to $3 \times 10^{19}$ per cm$^3$ and may have a thickness of 0.05 μm to 2 μm. A third cap layer is deposited over the second cap layer and comprises a third n-type doped semiconductor layer 312. The third cap layer may be, for example InP doped n-type to a carrier concentration from about $1 \times 10^{15}$ to $3 \times 10^{19}$ per cm$^3$ and may have a thickness of 0.1 μm to 2 μm. In cases where $In_{0.53}Ga_{0.47}As$ is used, the cap layers are composed of InP, i.e. $InAs_yP_{1-y}$ where y=0.

Figure 5:
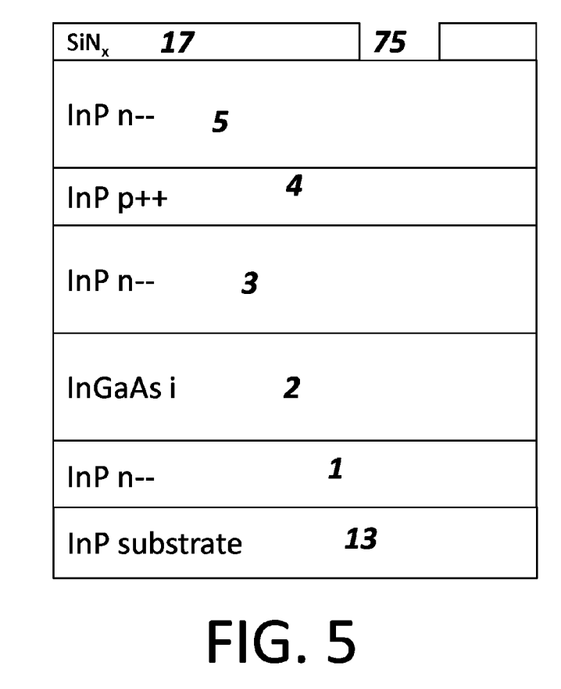
FIG. 5 is a diagram showing the deposition of a passivation layer, SiNx in this case but others can be used, with a hole (75) for adding the p-type dopant in a lattice matched photodiode.

In the embodiments shown in FIGS. 4A, 4B, and 5, the method 300 continues to step 314 after depositing the third, fourth, and fifth layers. However, after depositing any of the third, fourth, or fifth layers (i.e. after any of steps 308 or 310), a passivation layer may also be deposited and/or photolithography can be used to designate where the ion-implantation or diffusion will occur. This is shown in FIG. 5 as passivation layer 17 and one or more holes 75. Alternatively once the third layer is deposited (layer 3 of FIGS. 4A and 4B), a passivation layer (e.g. a layer composed of $SiN_x$) is deposited 314 and/or basic photolithography techniques maybe utilized to designate the p-type region of 6. Alternatively, the passivation layer may be deposited and/or photolithography techniques maybe used after the fourth layer is deposited to designate the p-type region of 6. The embodiments are not limited in this regard. If a passivation layer is deposited, one or more holes are opened in the passivation layer using photolithographic techniques 316. The formation of a photodetector p-n or p-i-n in the undoped or intrinsic layer may be performed 318 using any of the aforementioned techniques. The passivation layer or photolithographic material, with the one or more holes (i.e., holes 75), provides a mask to precisely place the photodetector in the lower layers, as described below.

Figure 6:
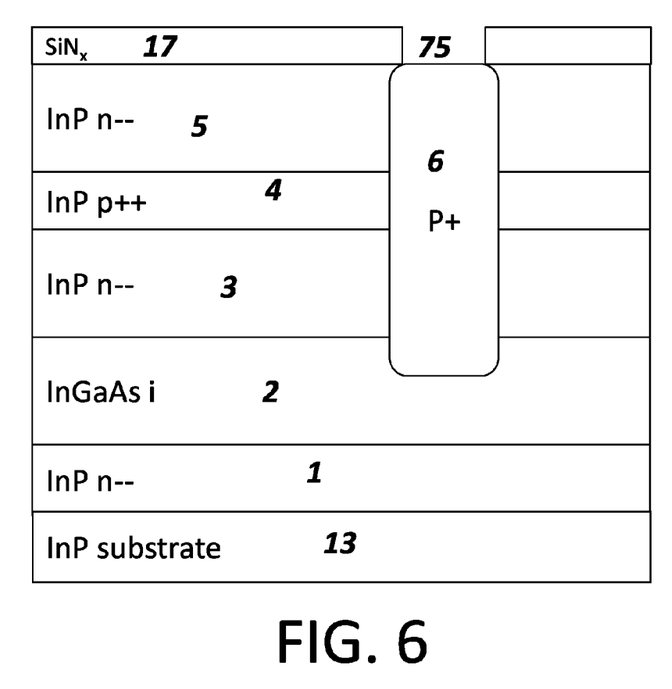
FIG. 6 is a diagram showing the region of the diffused or ion-implantation of a p-type dopant to form the photodetector in a lattice matched photodiode.
Figure 7:
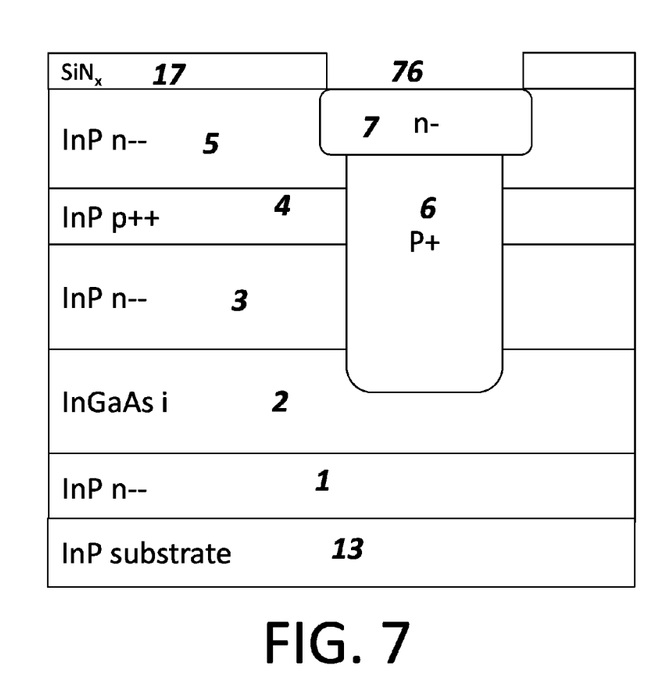
FIG. 7 is a diagram showing a larger area opening (76) then (75) and above (6) in the passivation layer to allow the deposition of an n-type semiconductor region by diffusion or ion implantation to bury the photodetector in a lattice matched photodiode.

Referring now to FIG. 6, the buried photodiode 6 is formed by diffusing or ion-implanting a p-type dopant through the fifth, fourth, and/or the third layers (5, 4, 3) and into the undoped or intrinsic semiconductor layer. The photodiode may be a diffused or ion-implanted p-type region through and forming a photodetector of p-i-n or p-n. The p-type dopant may be diffused to a depth of about 0.1 to 5.5 μm into the undoped or intrinsic semiconductor layer 2. If either the fourth or the fifth layer has not yet been deposited, the passivation layer deposited in 314 is removed and the fourth and/or fifth layers are deposited 320. The process 300 then continues on FIG. 3B at point A. Alternatively, if the fourth and fifth layers have been previously deposited, the process continues on FIG. 3B at point B where an n-type region is diffused or ion-implanted over the p-type dopant diffusion to provide an n-type doped surface 322. This is shown in FIG. 7 as n-type region 7.

Figure 8:
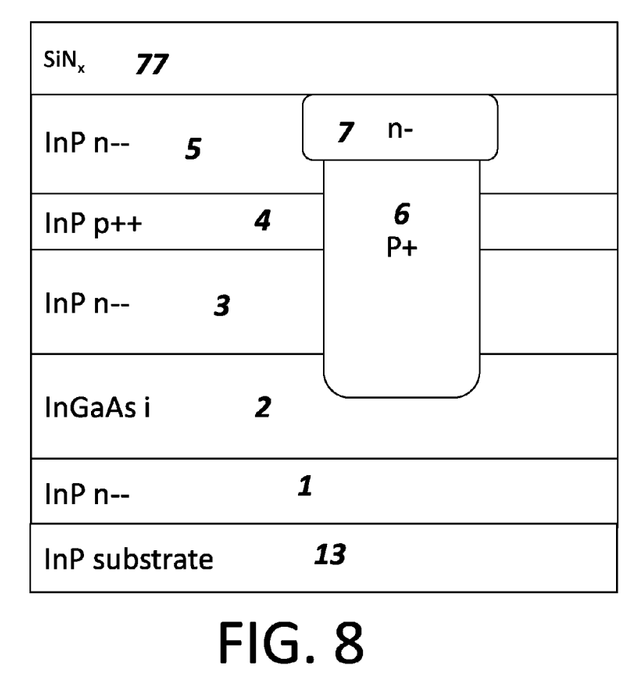
FIG. 8 is a diagram showing the deposition of a another passivation layer (77) to fill in the hole over the buried photodetector (6,7) in a lattice matched photodiode.
Figure 9:
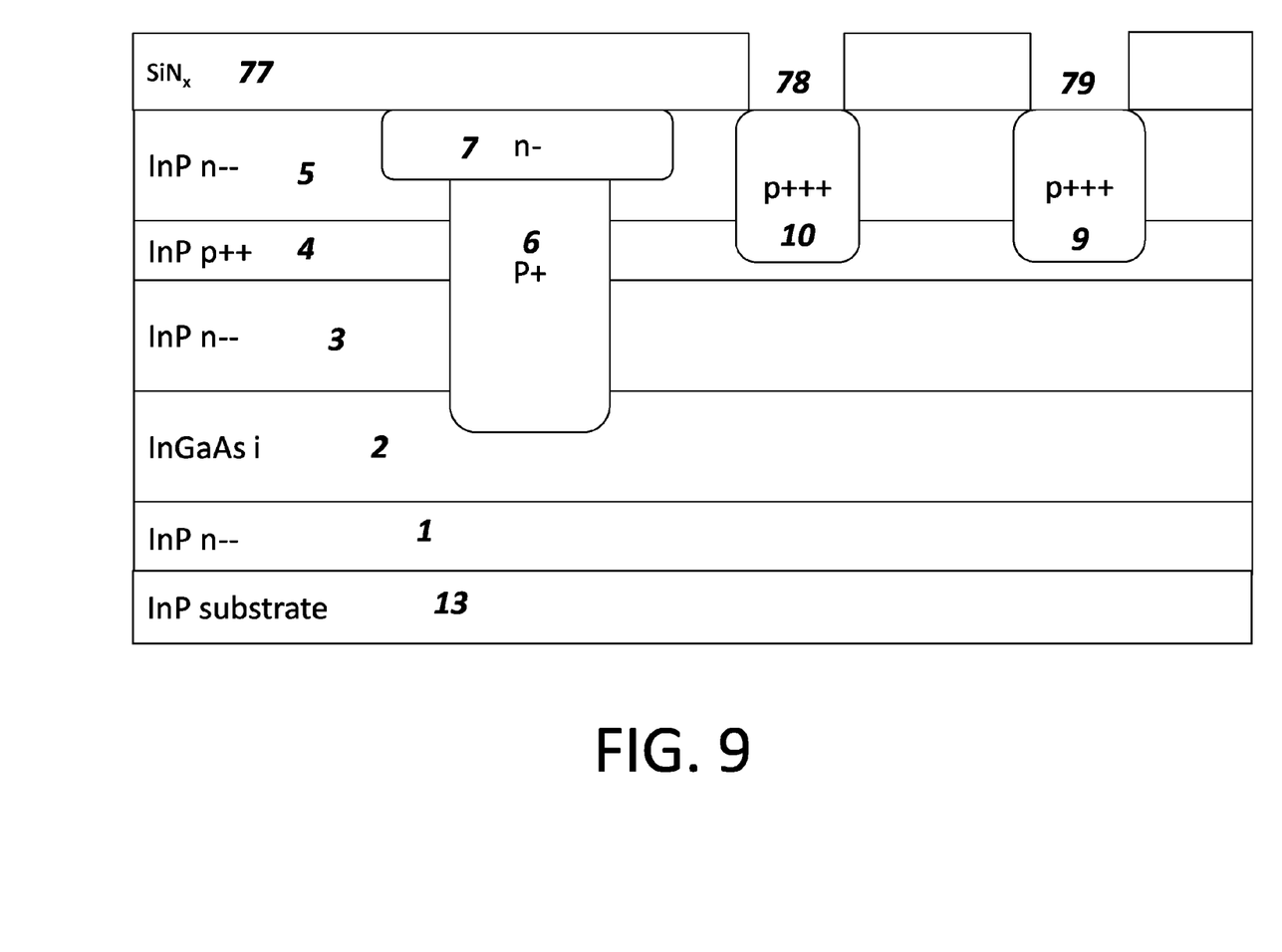
FIG. 9 is a diagram showing new openings in the passivation layer (77) to enable the diffusion or ion-implantation of p-type dopants to form the drains of the junction field effect transistors (JFETs) in a lattice matched photodiode.
Figure 10:
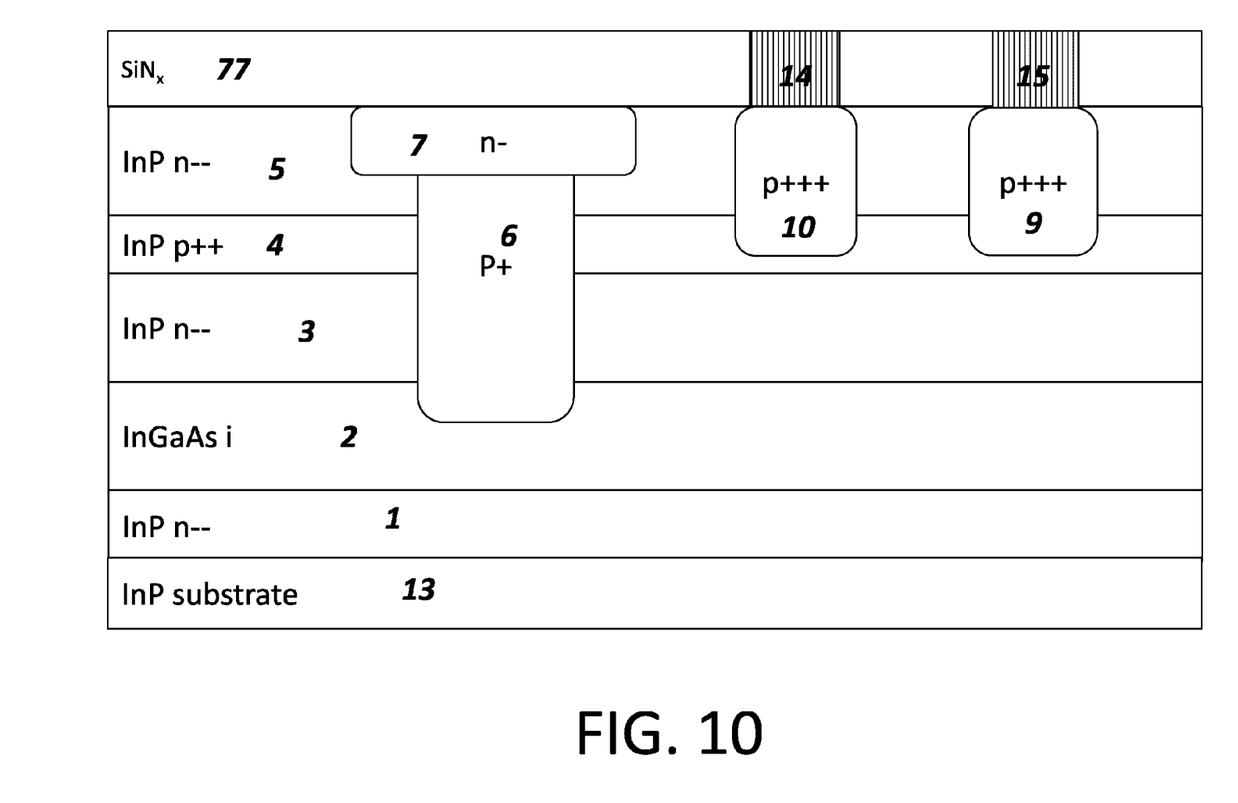

After either of steps 320 of FIG. 3A or 322 of FIG. 3B, a passivation layer is reapplied over at least the n-type layer deposited over the photodetector or over the entire surface, depending on when the photodetector was formed in the above process 324. This is shown in FIG. 8 as passivation layer 77 extending over n-type layer 7. Referring to FIG. 9, holes 78, 79 are opened in passivation layer 77 (step 326), and a p-type dopant is diffused in the open areas to form the JFETs drains 9, 10 (step 328). As shown in FIG. 10, the contacts 14, and 15 are deposited using standard photolithographic techniques to make openings in the passivation layer 77 to form the p-contacts for the JFET drains (step 330).

Figure 11:
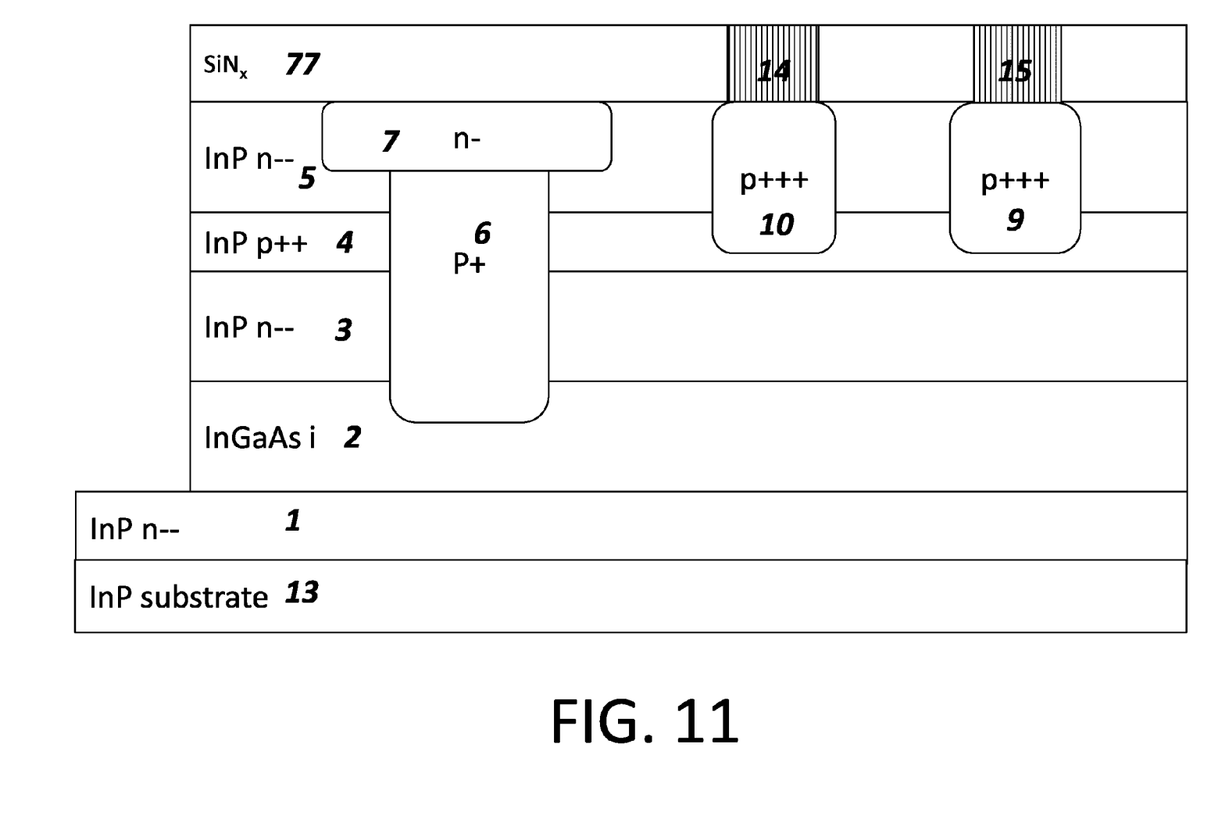
FIG. 11 is a diagram showing the channel etch to the cathode contact or first epitaxy layer (1) in a lattice matched photodiode.

After step 330 photolithographic steps (or other semiconductor processing technique) would be used to make a new hole on the end of the array in the passivation 77. After making a hole in the passivation then material would be removed from layer 5, 4, 3, and 2 to allow a connection to the first InP layer 1 or the substrate 13 as seen in FIG. 11 (step 332). This hole will enable an n-contact for the cathode connection, 60.

Figure 12:
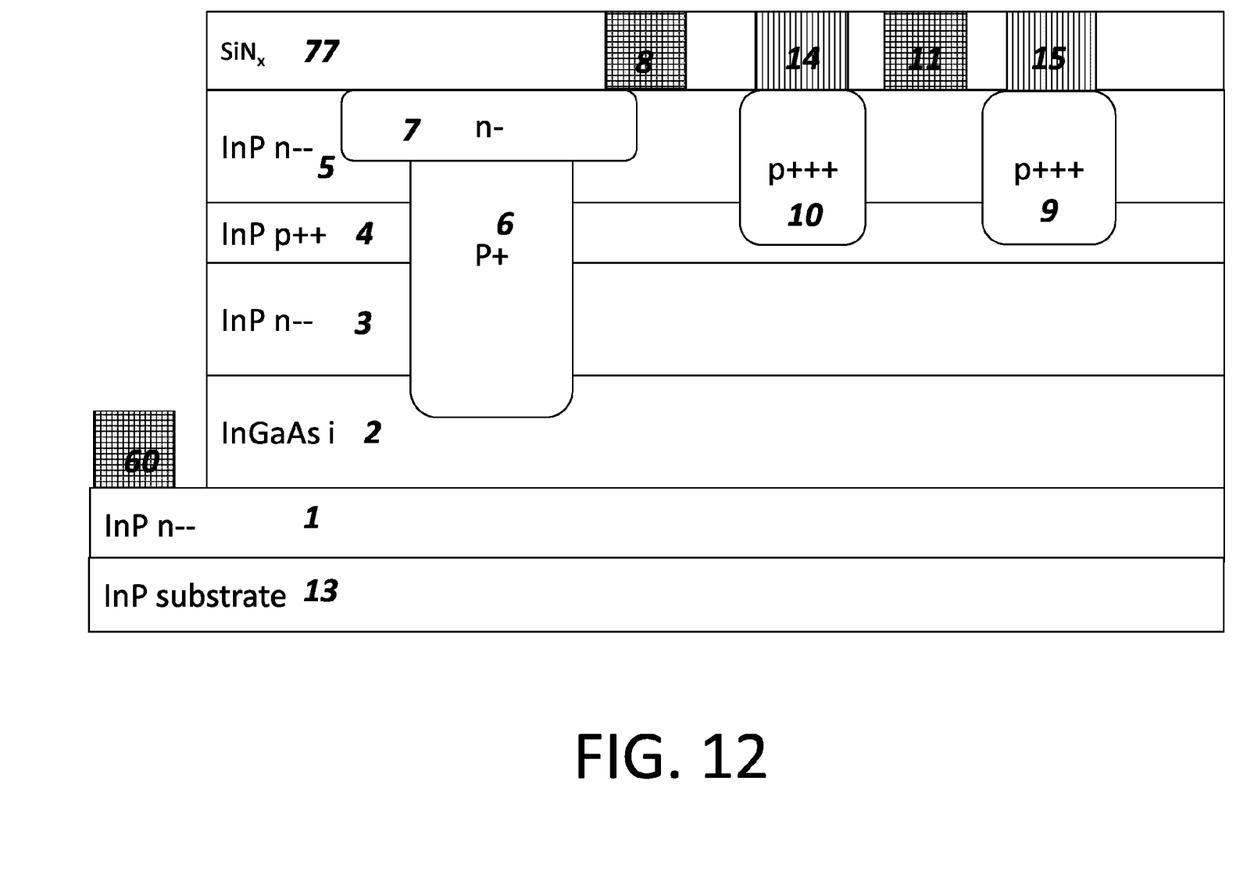
FIG. 12 is a diagram showing the n-contacts for the gates for the JFETs (8,11) as well as the cathode contact (60) for the photodiode in a lattice matched photodiode.

Holes would then be opened in 77 using photolithography (or other technique) to form the n-contacts for the JFET gates (8 and 11). The n-contact would then be applied to form n-contacts for the JFET gates (8 and 11) as well as the cathode contact 60 on the substrate 13. (step 334)

I claim:

1. A focal plane array comprising:
   a photodiode array that includes a plurality pixels, each of which includes:
   a buried photodiode, comprising a p-type region of an $In_xGa_{1-x}As$ layer and at least one cap layer, wherein the p-type region is doped by diffusing or ion-implanting a p-type dopant through the at least one cap layer, and wherein the p-type region is buried underneath an n-type region such that the p-type region does not contact the surface of the at least one cap layer; and
   a first junction field effect transistor (JFET) proximate to the buried photodiode and operative to remove charge from the buried photodiode; and
   a second JFET proximate to the first JFET and operative to remove charge from the first JFET; and
   a read out integrated circuit (ROIC) including an amplification and storage circuit, wherein ROIC is hybridized to the photodiode array, and wherein the ROIC has circuitry that is capable of controlling the gate voltages of gates of the first and second JFETs to cause charge to flow from buried photodiode through at least one of the first and second JFETs without an ohmic connection between the buried photodiode and the amplification and storage circuit.

2. The focal plane detector array according to claim 1, further comprising:
   a substrate;
   at least one buffer layer, formed on the substrate, of n-type material at least partly composed of indium;
   an $In_xGa_{1-x}As$ layer, formed a topmost of the at least one buffer layers, of intrinsic or undoped material;
   a first cap layer, formed on the $In_xGa_{1-x}As$ layer, of n-type material at least partly composed of indium;
   a second cap layer, formed on the first cap layer, of p-type material at least partly composed of indium; and
   a third cap layer, formed on the second cap layer of n-type material at least partly composed of indium.

3. The photodiode array according to claim 2, wherein a first and second JFET drains are formed by p-type regions which are deep enough to reach the second cap layer but not deep enough to enter the first cap layer.

4. The focal plane detector array according to claim 1, wherein the second JFET is linearly distributed across a row or a column of the photodiode array.

5. The focal plane detector array according to claim 1, wherein each pixel of the plurality of pixels includes an independent second JFET.

6. The focal plane detector array according to claim 1, wherein the flow of charge from the buried photodiode is controlled by varying gate voltages of the first and second JFETs using the ROIC.

* * * * *